United States Patent
Waki

(10) Patent No.: US 7,009,870 B2
(45) Date of Patent: Mar. 7, 2006

(54) SEMICONDUCTOR INTEGRATED CIRCUIT APPARATUS

(75) Inventor: Naosumi Waki, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 165 days.

(21) Appl. No.: 10/784,667

(22) Filed: Feb. 23, 2004

(65) Prior Publication Data

US 2004/0257141 A1    Dec. 23, 2004

(30) Foreign Application Priority Data

Jun. 19, 2003    (JP)    ............................. 2003-174748

(51) Int. Cl.
*G11C 11/24*    (2006.01)
(52) U.S. Cl. .................. 365/149; 365/183.03; 365/206
(58) Field of Classification Search .............. 365/149, 365/189.03, 206; 361/764
See application file for complete search history.

(56) References Cited

U.S. PATENT DOCUMENTS

| | | | | |
|---|---|---|---|---|
| 5,590,086 A | * | 12/1996 | Park et al. | ............. 365/230.03 |
| 6,853,559 B1 | * | 2/2005 | Panella et al. | ............... 361/764 |
| 6,936,917 B1 | * | 8/2005 | Lopata et al. | ................ 257/704 |

* cited by examiner

*Primary Examiner*—Tuan T. Nguyen
(74) *Attorney, Agent, or Firm*—Ladas & Parry LLP

(57) ABSTRACT

A semiconductor integrated circuit apparatus that is capable of reducing crosstalk without increasing the number of low impedance external terminals is realized by implementing first external terminals that are adapted to input/output high frequency signals of various channels, a second external terminal that has a higher impedance than the first external terminals and is implemented between two of the first external terminals, and a capacitor of which one end is connected to the second external terminal and the other end is arranged to have a predetermined electrical potential.

4 Claims, 5 Drawing Sheets

SEMICONDUCTOR INTEGRATED CIRCUIT APPARATUS

BACKGROUND OF THE INVENTION

1. Field of the Invention

The present invention relates generally to a semiconductor integrated circuit apparatus, and particularly to a semiconductor integrated circuit apparatus that inputs/outputs high frequency signals of a plurality of channels.

2. Description of the Related Art

In a semiconductor integrated circuit apparatus that inputs/outputs high frequency signals such as video signals, crosstalk between external terminals of the semiconductor integrated circuit apparatus caused by the influences of stray capacitance between the external terminals that input/output high frequency signals poses a problem. Thus, in the conventional art, low impedance external terminals such as an external terminal of the power source Vcc and an external terminal of the ground GND are implemented between two external terminals that input/output high frequency signals.

FIG. 1 is a plan view of an exemplary semiconductor integrated circuit apparatus of the conventional art. In this drawing, external terminals $12a$~$12x$ are implemented around the periphery of a semiconductor integrated circuit apparatus main body 10. Of the external terminals $12a$~$12x$, the external terminals $12a$, $12c$, and $12e$ correspond to external terminals that input/output video signals. The external terminal $12b$ that is positioned between the external terminals $12a$ and $12c$ corresponds to an external terminal for inputting power to the power source Vcc, and the external terminal $12d$ that is positioned between external terminals $12c$ and $12e$ corresponds to an external terminal for the ground GND.

As the number of video signals (number of channels) that are input/output to/from the semiconductor integrated circuit apparatus increases, a deficiency arises in the number of low impedance external terminals such as the external power source Vcc terminal and the external ground GND terminal, and low impedance external terminals are added to make up for the deficiency. Thus, the number of external terminals is inevitably increased. Also, since the low impedance external terminal is arranged to be positioned between the external terminals for video signal input/output, little flexibility is provided in positioning the external terminals.

SUMMARY OF THE INVENTION

The present invention has been conceived in response to the problems of the related art, and its object is to provide a semiconductor integrated circuit apparatus that is capable of reducing crosstalk without increasing the number of low impedance external terminals.

Specifically, the present invention provides a semiconductor integrated circuit apparatus that is adapted to input/output high frequency signals of a plurality of channels, the apparatus including:

first external terminals that are adapted to input/output the high frequency signals of the corresponding plurality of channels;

a second external terminal that has a higher impedance than the first external terminals and is implemented between the first external terminals; and a capacitor of which one end is connected to the second external terminal and the other end is arranged to have a predetermined electrical potential.

According to the present invention, crosstalk generated between the first external terminals may be reduced without increasing the number of low impedance external terminals.

In a further embodiment of the present invention, the second external terminal may correspond to at least one of an external terminal for D video terminal connection verification and an external terminal for D video terminal determination.

In another embodiment of the present invention, the second external terminal may correspond to at least one of an external terminal for S video terminal connection verification and an external terminal for S video terminal determination.

In another embodiment of the present invention, the high frequency signals may correspond to video signals.

DETAILED DESCRIPTION OF THE PREFERRED EMBODIMENTS

In the following, principles and embodiments of the present invention are described with reference to the accompanying drawings.

Figure 1:
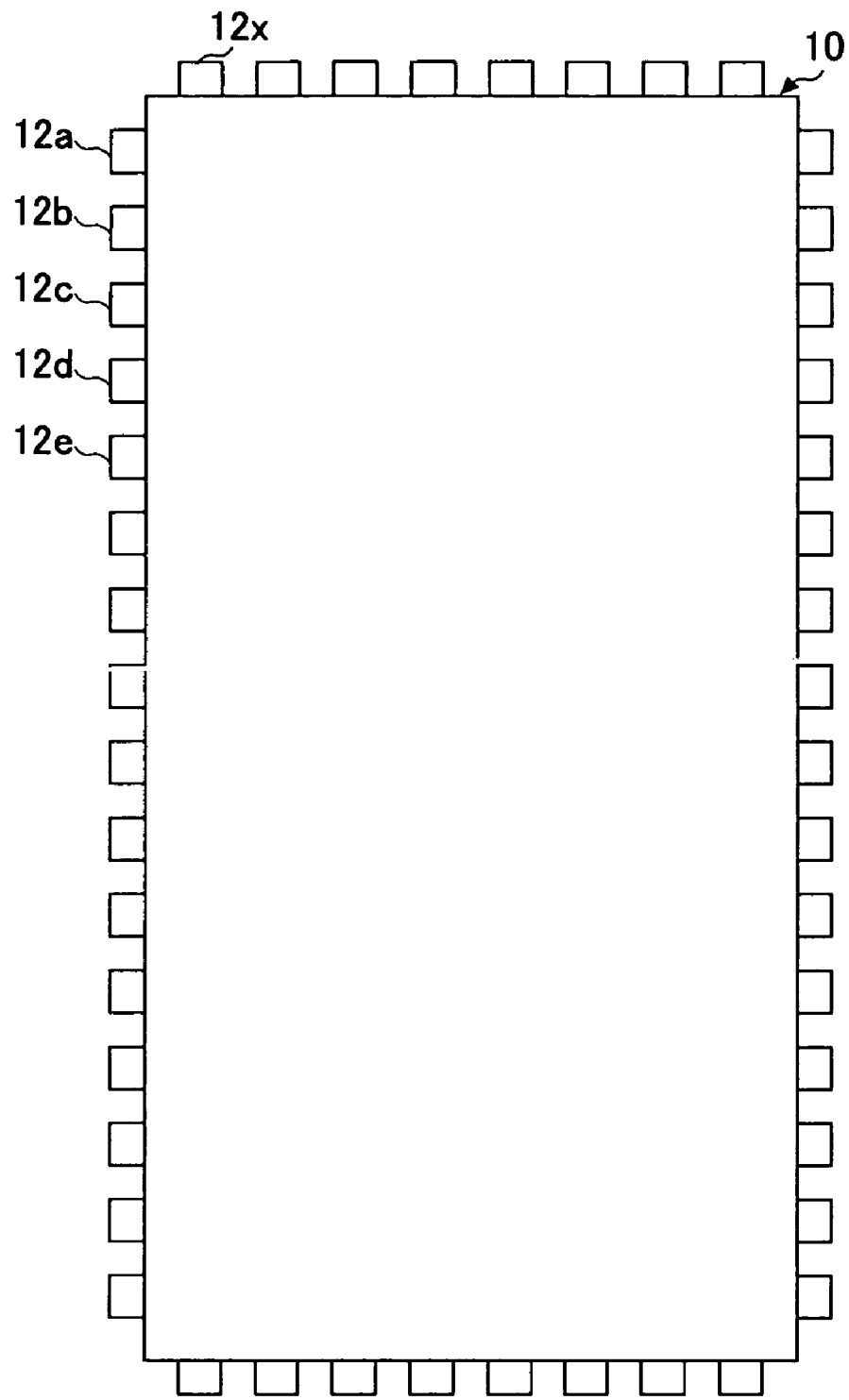
FIG. 1 is a plan view of a semiconductor integrated circuit apparatus according to the conventional art.
Figure 2:
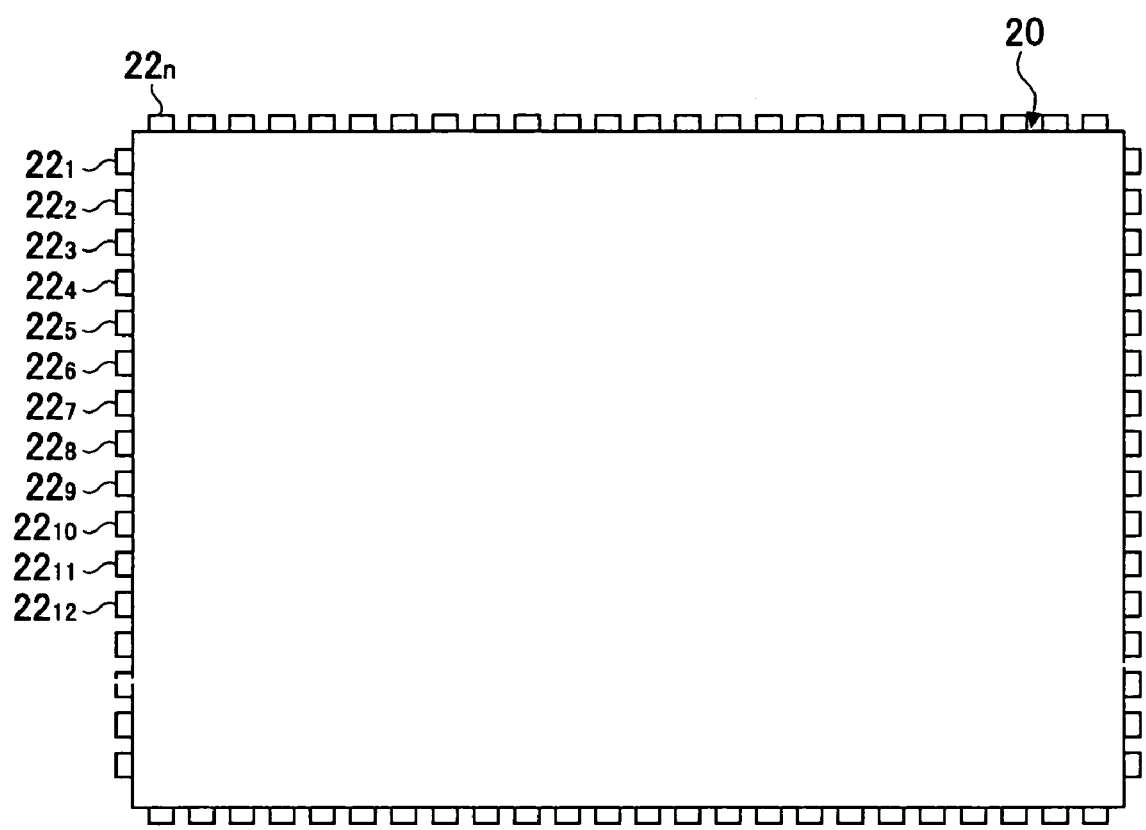
FIG. 2 is a plan view of a semiconductor integrated circuit apparatus according to an embodiment of the present invention.

FIG. 2 is a plan view of a semiconductor integrated circuit apparatus according to an embodiment of the present invention. In this drawing, plural external terminals $22_1$–$22_n$ are positioned around the periphery or a semiconductor integrated circuit apparatus main body 20. The external terminals $22_2$, $22_4$, $22_6$, $22_8$, $22_{10}$, and $22_{12}$ correspond to external terminals to/from which video signals are input/output.

The external terminal $22_1$ corresponds to an external terminal for inputting power to the power source Vcc, and external terminal $22_3$ positioned between the external terminals $22_2$ and $22_4$ corresponds to an external terminal for the ground GND. The external terminal $22_5$, corresponding to an external terminal for inputting power to the power source Vcc and positioned between the external terminals $22_4$ and $22_6$, is used as an external terminal for D terminal connection verification. The external terminal $22_7$, positioned between the external terminals $22_6$ and $22_8$, the external terminal $22_9$, positioned between the external terminals $22_8$ and $22_{10}$, and the external terminal $22_{11}$, positioned between the external terminals $22_{10}$ and $22_{12}$, are used as external terminals for D terminal determination.

It is noted that 'D terminal' is an abbreviated generic term for 'D video terminal', which is a standardized terminal for digital broadcasting. The external terminal $22_5$ for D terminal connection verification determines whether the D terminal is shorted with the external ground GND terminal to determine whether the D terminal cable is connected (the D terminal is shorted with the external ground GND terminal when it is connected). The external terminals $22_7$, $22_9$, and $22_{11}$, for D terminal determination are arranged to determine their respective video format to aspect ratios depending on whether their respective voltages correspond to 5 V, 2.2 V, or 0V. That is, the external terminals $22_5$, $22_7$, $22_9$, and $22_{11}$ are adapted to detect a direct current voltage.

Figure 3:
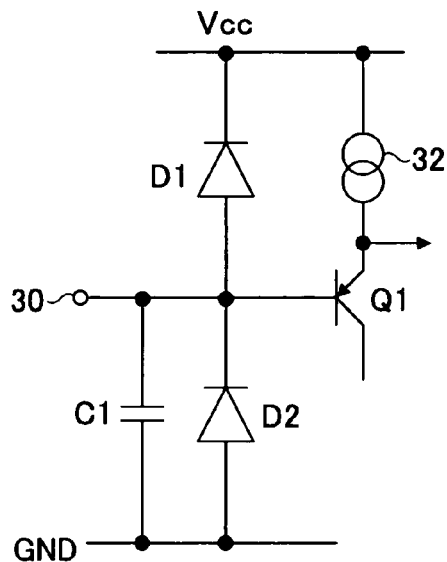
FIG. 3 is a circuit diagram showing an exemplary configuration of an interface circuit to which an external terminal for D terminal connection verification or D terminal determination is connected within the semiconductor integrated circuit apparatus of the embodiment.

FIG. 3 is a circuit diagram illustrating an exemplary configuration of an interface circuit to which the external terminals $22_5$, $22_7$, $22_9$, and $22_{11}$, for D terminal connection verification or D terminal determination are connected within the semiconductor integrated circuit apparatus of the present embodiment. In this drawing, the anode of a diode D1, the cathode of a diode D2, the base of a pnp transistor Q1, and one end of a condenser C1 are connected to an external terminal 30.

The cathode of the diode D1 is connected to the power source Vcc, and the anode of the diode D2 is grounded. The emitter of the transistor Q1 is connected to the power source Vcc via a fixed current source 32, and this emitter output is supplied to an ensuing circuit. The other end of the condenser C1 is grounded.

Conventionally, the condenser C1 is not implemented in the interface circuit, and the external terminal 30 has high impedance (e.g., direct current resistance of approximately 100 kΩ). However, in the embodiment, by implementing the condenser C1 (e.g., capacitance 10 pF), the external terminal 30 may be arranged to have low impedance with respect to the video signals supplied thereto. At the external terminals $22_5$, $22_7$, $22_9$, and $22_{11}$, for D terminal connection verification or D terminal determination, the external terminal 30 is used in an open state or in a state where a predetermined direct voltage is being applied. Thus, connecting the condenser C1 to the external terminal 30 to realize low impedance does not cause any problem.

Figure 4:
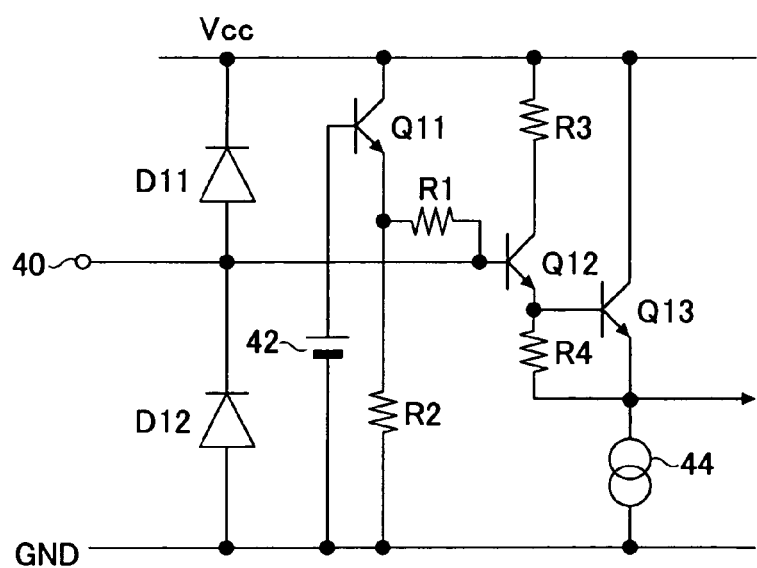
FIG. 4 is a circuit diagram showing an exemplary configuration of an interface circuit to which an external terminal for video signal input/output is connected within the semiconductor integrated circuit apparatus of the embodiment.

FIG. 4 is a circuit diagram illustrating an exemplary circuit configuration of an interface circuit to which the external terminals $22_2$, $22_4$, $22_6$, $22_8$, $22_{10}$, and $22_{12}$ for video signal input are connected within the semiconductor integrated circuit apparatus of the present embodiment. In the drawing, the anode of a diode D11, the cathode of a diode D12, the base of an npn transistor Q12, and one end of a resistor R1 are connected to an external terminal 40.

The cathode of the diode D11 is connected to the power source Vcc, and the anode of the diode D12 is grounded. The other end of the resistor R1 is connected to the emitter of a npn transistor Q11 and one end of a resistor R2, and the other end of the resistor R2 is grounded. The collector of the transistor Q11 is connected to the power source Vcc, and a predetermined voltage is applied to its base from a fixed voltage source 42.

The collector of the transistor Q12 is connected to the power source Vcc via a resistor R3, and the emitter of the transistor Q12 is connected to the base of a npn transistor Q13. A resistor R4 is implemented between the base and emitter of the transistor Q13, and the collector of the transistor Q13 is connected to the power source Vcc. The emitter of the transistor Q13 is grounded via a fixed current source 44, and this emitter output is supplied to an ensuing circuit. The impedance of the external terminal 40 is arranged to correspond to a direct current resistance of 75Ω, for example.

Figure 5:
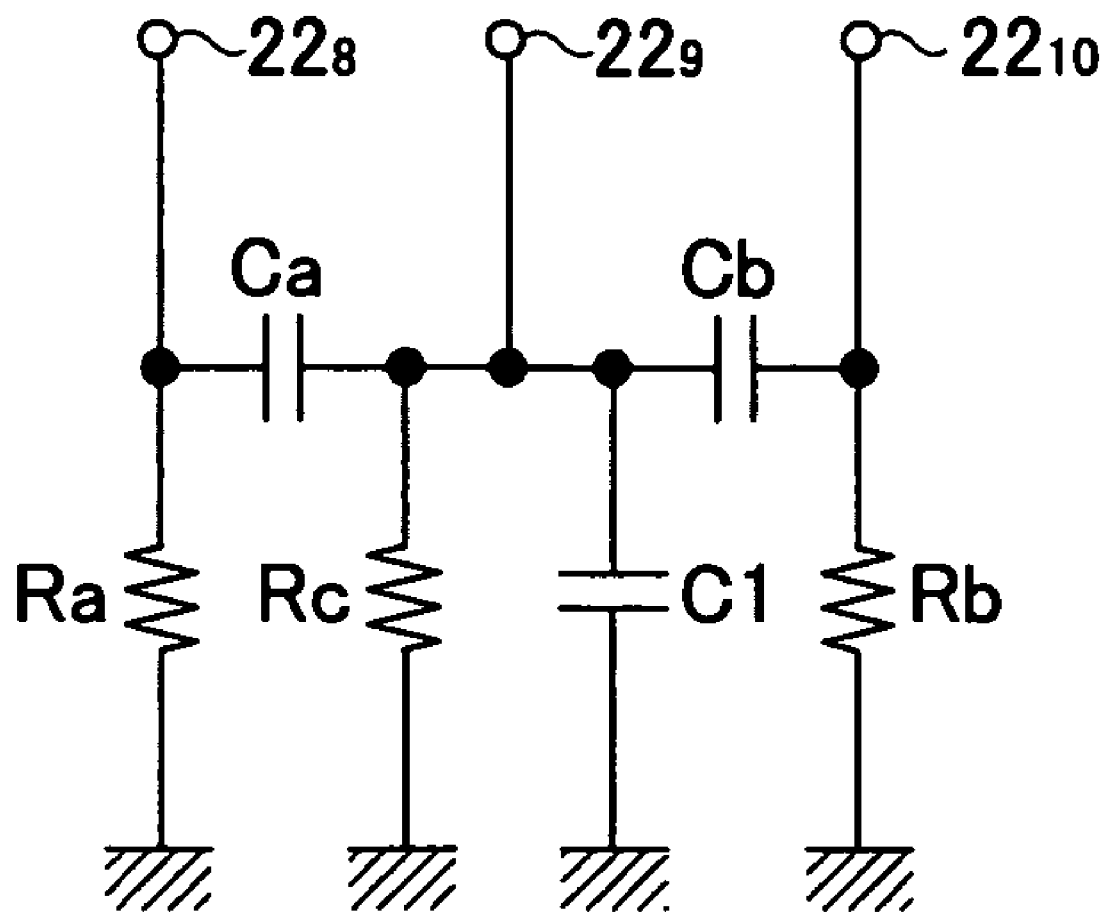
FIG. 5 is a circuit diagram showing circuit configurations of external terminals of the semiconductor integrated circuit apparatus of the embodiment.

FIG. 5 is a circuit diagram illustrating the external terminals of the semiconductor integrated circuit apparatus of the present embodiment. In this drawing, a video signal is input to the external terminal $22_8$. The respective direct current resistances Ra and Rb of the external terminals $22_8$ and $22_{10}$ are arranged to be 75Ω, the direct current resistance Rc of the external terminal $22_9$ is arranged to be 100Ω, and the external terminal $22_9$ is grounded via the condenser C1 having a capacitance of 10 pF. Stray capacitance Ca is generated between the external terminals $22_8$ and $22_9$, and stray capacitance Cb is generated between the external terminals $22_9$ and $22_{10}$. It is noted that the stray capacitances Ca and Cb are approximately 0.5 pF each.

Figure 6:
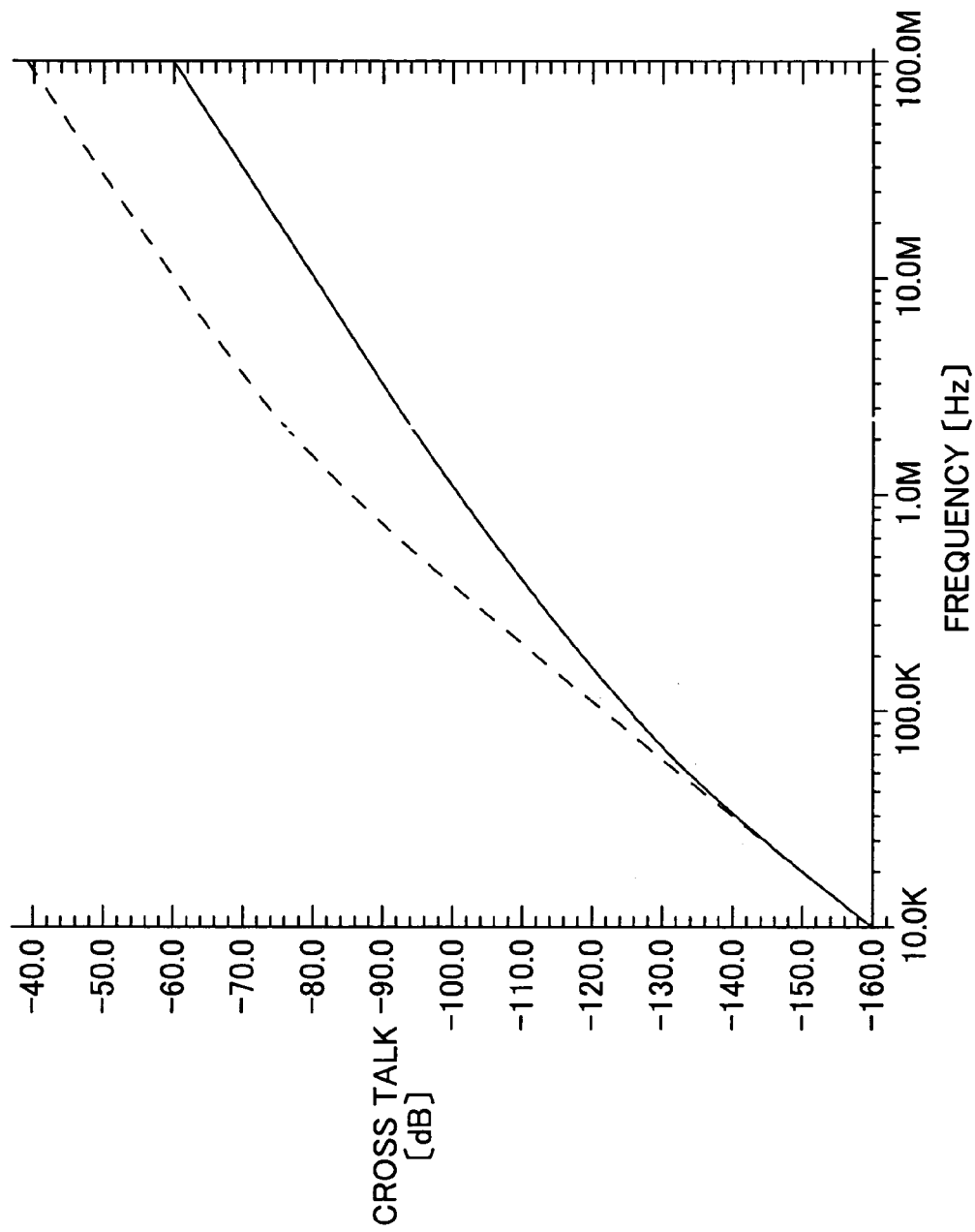
FIG. 6 is a graph showing characteristic crosstalk between the external terminals.

FIG. 6 is a graph illustrating crosstalk generated between external terminals. In this graph, the solid line represents the leakage of high frequency signals (crosstalk) occurring between the external terminals $22_8$ and $22_{10}$ in the circuit configuration shown in FIG. 5. As is shown in FIG. 6, for a signal having a frequency of 30 MHz or less, the crosstalk is no more than −70 dB. Thus, the crosstalk of video signals of which the maximum frequencies are 30 MHz or less may be ignored in the present arrangement. In contrast, the dashed line in FIG. 6 represents the leakage of high frequency signals (crosstalk) occurring between the external terminals $22_8$ and $22_{10}$ in an arrangement where the condenser C1 of the external terminal $22_9$ is removed from the circuit configuration of FIG. 5. In such case, the crosstalk exceeds −70 dB for signals having a frequency of 3.5 MHz or above, and thus, crosstalk of video signals cannot be ignored.

It is noted that in the above description of the embodiment, an application of the present invention on a D video terminal is illustrated as an example. However, the present invention is not limited to this embodiment, and for example, the present invention may be applied to a semiconductor integrated circuit apparatus having an S video terminal. In such case, external terminals for S terminal connection verification or S terminal determination may be provided in addition to the external terminals for video signal input/output, each of these external terminals for S terminal connection verification or S terminal determination may be placed in between the external terminals for video signal input/output, and a condenser may be implemented for each of the external terminals for S terminal connection verification or S terminal determination in order to realize low impedance in these terminals.

The present application is based on and claims the benefits of the priority date of Japanese Patent Application No.2003-174748 filed on Jun. 19, 2003, the entire contents of which are hereby incorporated by reference.

What is claimed is:

1. A semiconductor integrated circuit apparatus that is adapted to input/output high frequency signals of a plurality of channels, the apparatus comprising:
   a plurality of first external terminals that are adapted to input/output the high frequency signals of the corresponding channels;
   a second external terminal that has a higher impedance than the first external terminals and is implemented between the first external terminals; and a capacitor unit of which one end is connected to the second external terminal and the other end is arranged to have a predetermined electrical potential.

2. The semiconductor integrated circuit apparatus as claimed in claim 1, wherein:

the second external terminal corresponds to at least one of an external terminal for D video terminal connection verification and an external terminal for D video terminal determination.

3. The semiconductor integrated circuit apparatus as claimed in claim 1, wherein:

the second external terminal corresponds to at least one of an external terminal for S video terminal connection verification and an external terminal for S video terminal determination.

4. The semiconductor integrated circuit apparatus as claimed in claim 1, wherein:

the high frequency signals correspond to video signals.

* * * * *